US006165028A

United States Patent [19]

Hirai et al.

[11] Patent Number: 6,165,028
[45] Date of Patent: *Dec. 26, 2000

[54] CARD CONNECTOR AND A METHOD OF MOUNTING THE SAME ON AN ASSOCIATED PRINTED CIRCUIT BOARD

[75] Inventors: Yuji Hirai; Kenichi Yotsutani, both of Tokyo, Japan

[73] Assignee: Honda Tsushin Kogyo Co., Ltd., Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/937,017

[22] Filed: Sep. 24, 1997

[30] Foreign Application Priority Data

Feb. 18, 1997 [JP] Japan .................................... 9-033562

[51] Int. Cl.[7] .............................. H01R 13/11; H05K 1/00
[52] U.S. Cl. .............................................. 439/857; 439/79
[58] Field of Search .............................. 439/79, 856, 857

[56] References Cited

U.S. PATENT DOCUMENTS

| | | | |
|---|---|---|---|
| 4,734,042 | 3/1988 | Martens et al. | 439/62 |
| 5,184,963 | 2/1993 | Ishikawa | 439/79 |
| 5,472,349 | 12/1995 | Dixon et al. | 439/79 |
| 5,591,035 | 1/1997 | Burkholder et al. | 439/79 |
| 5,702,257 | 12/1997 | Millhimes | 439/79 |
| 5,725,385 | 3/1998 | Takano et al. | 439/64 |
| 5,771,156 | 6/1998 | Wang | 361/737 |
| 5,807,137 | 9/1998 | Janota et al. | 439/607 |
| 5,816,847 | 10/1998 | Snyder | 439/500 |

*Primary Examiner*—Brian Sircus
*Assistant Examiner*—Chandrika Prasad
*Attorney, Agent, or Firm*—Arent Fox Kintner Plotkin & Kahn, PLLC

[57] ABSTRACT

Disclosed is an improved card bus connector whose insulating housing has bifurcate contact pieces and a shield plate fixed thereto. The leads of the bifurcate contact pieces and shield plate are connected to selected conductors of an associated printed circuit. The insulating housing has a contact-support mold press-fitted in its rear opening. The contact-support mold has the contact-to-lead transitions of the female contact pieces embedded therein. Each bifurcate contact piece has a stem offset from its center longitudinal contact line.

6 Claims, 7 Drawing Sheets

CARD CONNECTOR AND A METHOD OF MOUNTING THE SAME ON AN ASSOCIATED PRINTED CIRCUIT BOARD

BACKGROUND OF THE INVENTION

1. Field of the Invention

The present invention relates to a connector structure of a function-expanding card such as a PC card or memory card to be inserted in the card slot made in a personal computer for expanding the function of the personal computer, and a method of mounting such a connector on an associated printed circuit board.

2. Description of Related Art

Referring to FIG. 24, a PC card 1 is inserted in the card bus connector 2 mounted in a personal computer 7. Specifically the front of the PC card is inserted in the card slot of the card bus connector 2 until its female part 1*a* is mated with the male part of the card bus connector 2, thereby making a required electric connection between the CPU of the personal computer 7 and the PC card 1.

The card bus connector 2 has a card-ejection arm 3 pivoted about a stationary metal post 8, and the card-ejection arm 3 is operatively connected to a card-ejection lever 4 and operation buttons 5 and 6, which appear outside of the personal computer 7. Thus, the PC card 1 can be removably inserted in the card bus connector 2.

As seen from the drawing, the PC card 1 has a shield 1*b* on one surface of the female part 1*a*. The shield 1*b* can be electrically connected to the grounding conductors in the printed circuit on the computer side.

All contact pieces are press-fitted in the contact holes made in the insulating housing, leaving their soldering tails or leads behind to be exposed out of the insulating housing. It may be possible that some of the contact pieces are loosely fitted, and then the leads of all contact pieces cannot be laid in coplanar relation with the substrate of an associated printed circuit. The allowance of coplanar arrangement of leads is very strict; all soldering leads need to be put in contact with 0.1 millimeter thick creamy solder applied to selected conductors of the printed circuit for reflow-soldering.

As seen from FIG. 25, a male contact piece 9 is mated with a bifurcate female contact piece 1*c* of the card bus connector 1*a*. The male contact piece 9 is relatively long, and accordingly the front-to-root length of the bifurcate contact piece 1*c* is elongated. The rigidity and hence the contact pressure of the bifurcate female contact piece 1*c* against the male contact piece 9 decreases with the increase of the front-to-root length of the contact piece 1*c*. This is a major cause for making unreliable contact. Also, disadvantageously the assembling of parts is difficult significantly, compared with use of relatively short contact pieces.

If the bifurcate contact piece is deformed so much within the limited space as to increase the contact pressure of the female contact piece against the male contact piece, the opening size to accomodate the male contact piece in the limited space is reduced accordingly, so that the male contact piece cannot be inserted into the female contact piece with ease. The bifurcate female contact piece is long. Such elongation of female contact piece increases accordingly the manufacturing cost. Also disadvantageously, the resistance to insertion of the female contact piece into the contact hole will increase with the increase of the female contact size, causing a significant disadvantage to the assembling work.

SUMMARY OF THE INVENTION

One object of the present invention is to provide a card bus connector whose female contact pieces can accomodate relatively long male contact pieces in spite of their relatively short length, accordingly increasing the rigidity of the female contact pieces so as to assure application of good contact pressure to the male contact pieces.

To attain this object a card bus connector comprising an insulating housing having a plurality of bifurcate contact pieces mounted at predetermined places of the insulating housing, and a shield plate fixed to the surface of the insulating housing, the leads of the bifurcate contact pieces and shield plate being connected to selected conductors of an associated printed circuit, which has the card bus connector fixed on its substrate, is improved according to the present invention in that: each bifurcate contact piece has a stem offset from its center longitudinal contact line.

The female bifurcate contact piece has a stem offset from its center longitudinal contact line, thereby making the whole length of the female contact piece apparently short, still permitting it to accomodate a relatively long male contact piece while pinching the male contact piece between its bifurcate contact branches under an increased pressure, which is stronger than the contact pressure obtainable from the conventional bifurcate contact piece having its stem aligned with the bifurcate contact end.

Another object of the present invention is to provide a card bus connector whose female contact pieces are positively fixed to its insulating housing in such an exact position that their leads are aligned in coplanar relation relative to the substrate of an associated printed circuit.

To attain this object a card bus connector comprising an insulating housing having a plurality of bifurcate contact pieces mounted at predetermined places of the insulating housing, and a shield plate fixed to the surface of the insulating housing, the leads of the bifurcate contact pieces and shield plate being connected to selected conductors of an associated printed circuit, which has the card bus connector fixed on its substrate, is improved according to the present invention in that: the insulating housing has a contact-support mold press-fitted in its rear opening, the contact-support mold having the bifurcate contact-to-lead transitions embedded therein.

Since the female contact pieces have their leads put in precise coplanar relation relative to the substrate of the associated printed circuit, the complete reflow-soldering of the leads of female contact pieces to selected conductors in the printed circuit is assured.

Still another object of the present invention is to provide a method of mounting such a card bus connector to the substrate of an associated printed circuit.

A method of mounting on an associated printed circuit board a card bus connector comprising an insulating housing having a plurality of bifurcate contact pieces mounted at predetermined places of the insulating housing, and a shield plate fixed to the surface of the insulating housing, is improved according to the present invention in that it comprises the steps of: preparing a contact-support mold having the bifurcate contact-to-lead transitions embedded therein by insert-molding; press-fitting the contact-support mold in the rear opening of the insulating housing with the contact pieces fitted in contact holes made in the insulating housing; putting the insulating housing having the contact pieces mounted therein on the substrate of the associated printed circuit; reflow-soldering the leads of the contact pieces to selected conductors of the printed circuit; attaching the shield plate onto the insulating housing; and reflow-soldering the leads of the shield plate to another selected conductors of the printed circuit, thus mounting the card bus connector on the substrate of the printed circuit.

The numerous female contacts can be tightly held in the contact-support mold, not allowing any of them to be loosely retained therein. Thus the positive fixing of female contacts at exact position is attained, and this precise positioning permits easy insertion of female contacts in the contact holes made in the insulating housing. Also, the reflow-soldering of contact leads is effected in the absence of overhanging shield leads. This is advantageous to the dealing-with of defective or incomplete solderings if any, in the contact leads soldered to selected conductors in the printed circuit.

Other objects and advantages of the present invention will be understood from the following description of a card bus connector according to a preferred embodiment of the present invention, which is shown in accompanying drawings.

DESCRIPTION OF THE PREFERRED EMBODIMENT

Figure 1:
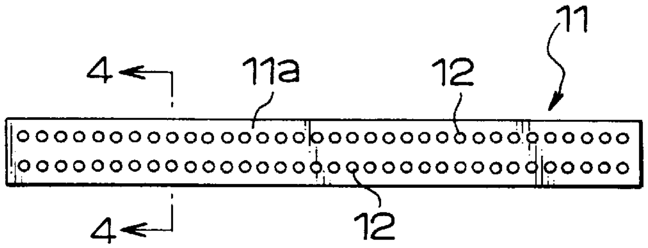
FIG. 1 is a front view of the insulating housing of the card bus connector.

FIGS. 1–23 illustrate a detailed example of the preferred embodiment of the invention.

A card bus connector 10 comprises an insulating housing 11 having bifurcate contact pieces 18 mounted therein, and a shield plate 17 fixed to the surface of the insulating housing 11. Referring to FIGS. 1 to 5, the insulating housing 11 comprises an elongated rectangular body of synthetic resin. As shown in the drawings, it has 68 through holes 12 parallel-arranged in upper and lower lines. The elongated rectangular body is about 3.3 mm (high), about 47 mm (long) and about 6.25 mm (wide).

Figure 2A:
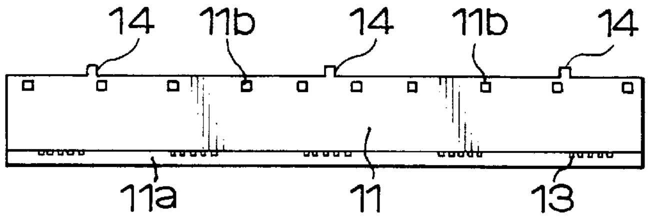
FIG. 2*a* is a plane view of the insulating housing of the card bus connector.
Figure 2B:
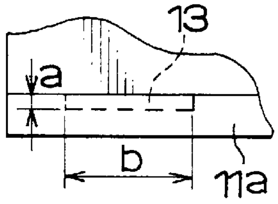
FIG. 2*b* is an enlarged plane view of a fragment of the insulating housing.
Figure 3:
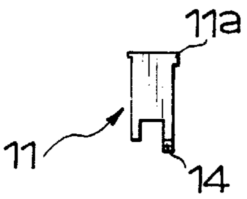
FIG. 3 is a side view of the insulating housing.

As seen from FIGS. 1 and 2, the elongated housing 11 has a front flange 11*a* formed on its upper, front side, and the front flange 11*a* has five engagement recesses 13 made at regular intervals. Some details of the engagement recess 13 are shown in FIG. 2*b*. For example, the engagement recess 13 is 0.2 mm deep (see “a”) and 3 mm long (see “b”).

Figure 6:
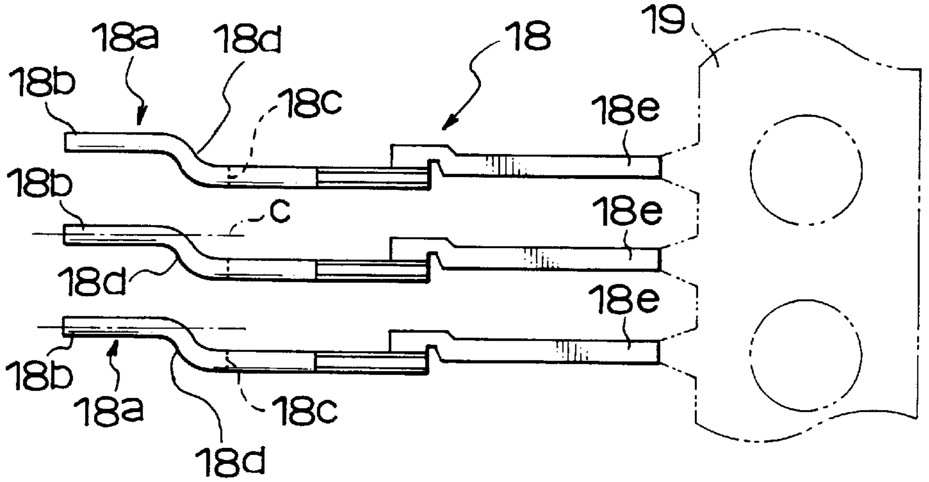
FIG. 6 shows how female bifurcate contact pieces can be made.

Each bifurcate contact piece 18 has a stem 18*c* offset from its center longitudinal contact line c (see FIG. 6). As seen from FIGS. 4 and 5, each through hole 12 has a step-wise transition 12*a* formed on its front side. The step-wise transition 12*a* is formed so as to be in conformity with the bifurcate contact-to-stem transition of the female contact piece 18.

Again referring to FIGS. 2 to 4, the insulating housing 11 has three engagement projections 14 formed on its rear longitudinal edge. The shield plate 17 has three “U”-shaped hooks 17*e* formed on its rear longitudinal edge (see FIG. 16). The shield plate 17 can be fixed onto the top surface of the insulating housing 11 by permitting the “U”-shaped hooks 17*e* to be caught by the engagement projections 14 of the insulating housing 11.

Figure 4:
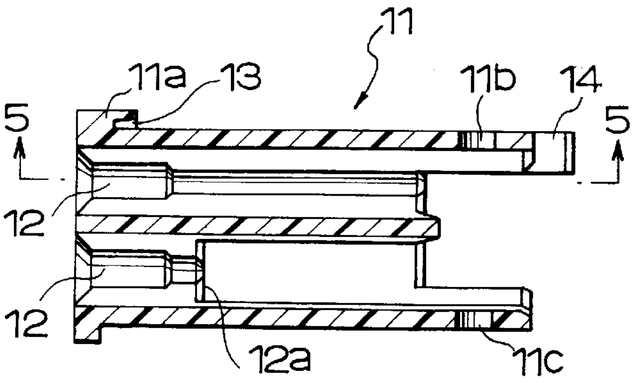
FIG. 4 is a cross section of the insulating housing taken along the line 4—4 in FIG. 1.
Figure 5:
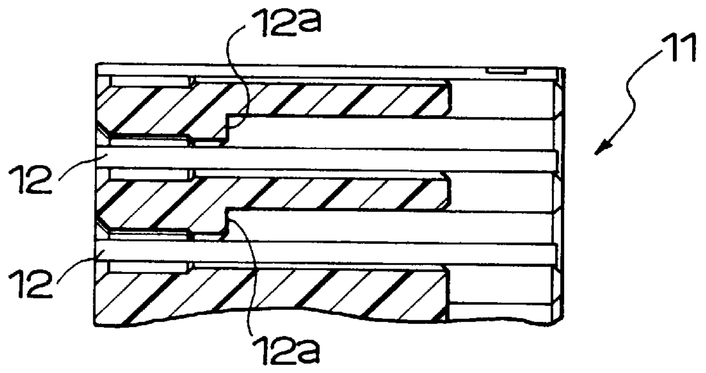
FIG. 5 is a sectional view of the insulating housing taken along the line 5—5 in FIG. 4.

The insulating housing 11 has engagement apertures 11*b* and 11*c* made in its rear longitudinal edge (see FIG. 4). These engagement apertures 11*b* and 11*c* are used for fixing a contact-support mold 16 (see FIGS. 9–14) to the insulating housing 11.

Figure 7:
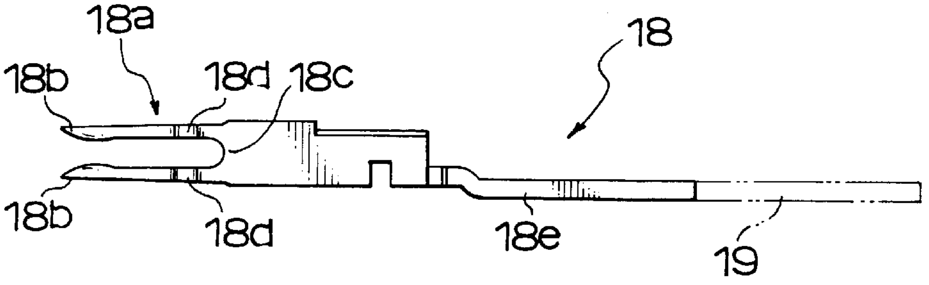
FIG. 7 is a front view of the bifurcate contact piece.
Figure 8A:
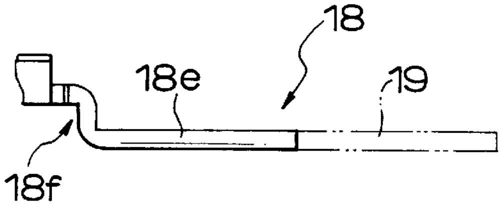
FIG. 8*a* shows one type of bifurcate contact piece.
Figure 8B:
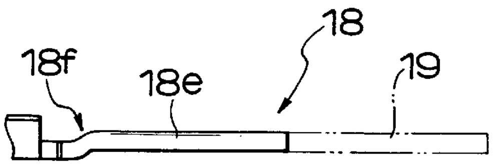
FIG. 8*b* shows another type of bifurcate contact piece.
Figure 9:
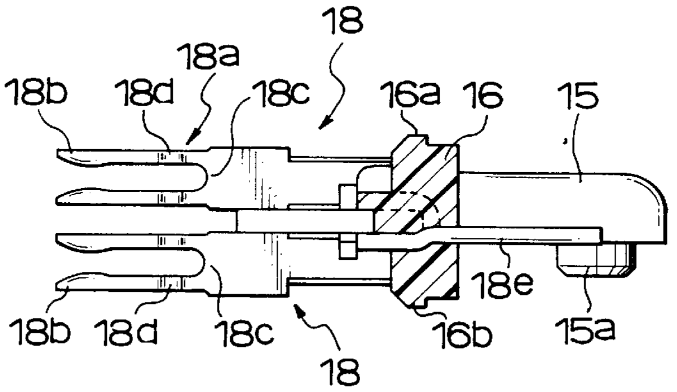
FIG. 9 is a cross section of a contact-support mold having bifurcate contact pieces embedded therein.
Figure 10:
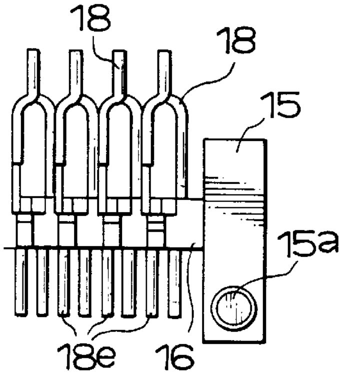
FIG. 10 is a bottom view of the contact-support mold.
Figure 11:
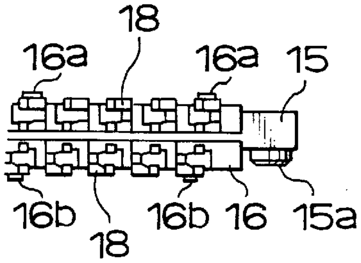
FIG. 11 shows a fragment of the contact-support mold.
Figure 12:
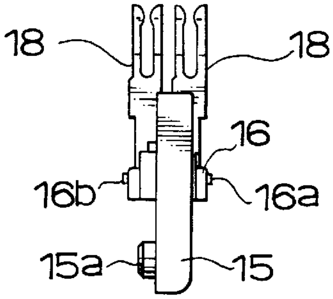
FIG. 12 is a side view of the contact-support mold.
Figure 13:
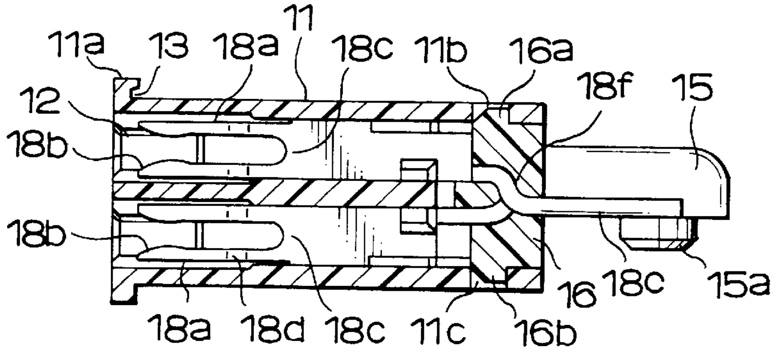
FIG. 13 is a cross section of an insulating housing having the contact-support mold press-fitted therein.
Figure 14:
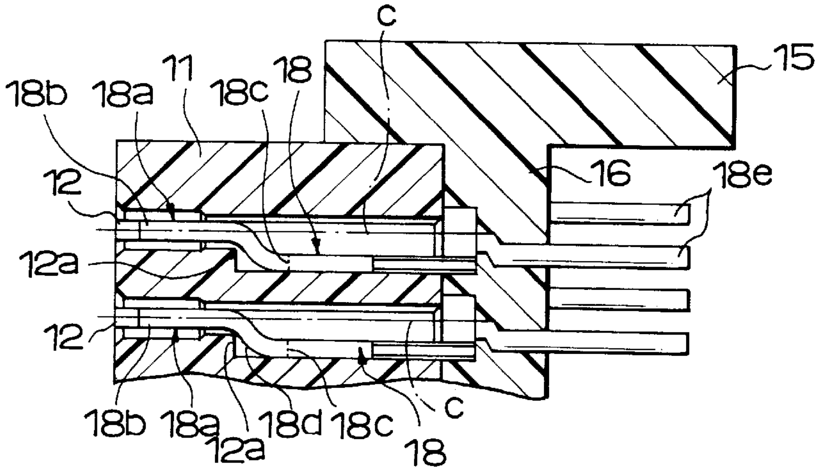
FIG. 14 is a cross section of a fragment of the insulating housing having the contact-support mold press-fitted therein.

Referring to FIGS. 6 and 7, bifurcate female contact pieces 18 are stamped from a metal sheet as being connected to a carrier strip 19. Each bifurcate female contact piece 18 is composed of a tuning fork-like contact section 18*a*, a stepwise transition 18*d* integrally connected to the contact section 18*a*, a stem section 18*c* integrally connected to the stepwise transition 18*d* and a lead extension 18*e* integrally connected to the stem section 18*c* via another step-wise transition. With this arrangement the stem section 18*c* is offset from the center longitudinal contact line “c” (see FIG. 6). The lead extension 18*e* is connected to the carrier strip 19.

The bifurcate female contact pieces 18 are press-inserted in the contact holes 12 arranged in upper and lower lines in the insulating housing 11, with their lead extension 18*e* laid behind to be contained in one and same plane. To attain the coplanar arrangement of lead extensions 18*e* the contact pieces 18 to be arranged in upper and lower lines have different contact-to-lead transitions in terms of directions and lengths as indicated by 18*f* in FIGS. 8*a* and 8*b*.

As described earlier, female contact pieces 18 are stamped out of an elongated strip of metal sheet, and a train of female contact pieces 18 thus formed is wound around a reel. The female contact pieces 18 are fed and insert-molded by unwinding the train of female contact pieces from the reel.

A contact-support mold 16 can be formed by embedding the stem-to-lead transitions 18*f* (see FIGS. 8*a*, 8*b* and 20) of the bifurcate female contact pieces 18. The carrier strip 19 is cut and removed after insert-molding. The contact-support mold 16 has engagement projections 16*a* and 16*b* on its top and bottom surfaces to be caught by counter engagement holes 11*b* and 11*c* made in the insulating housing 11 when snapping the contact-support mold 16 in the rear opening of the insulating housing 11.

Figure 20:
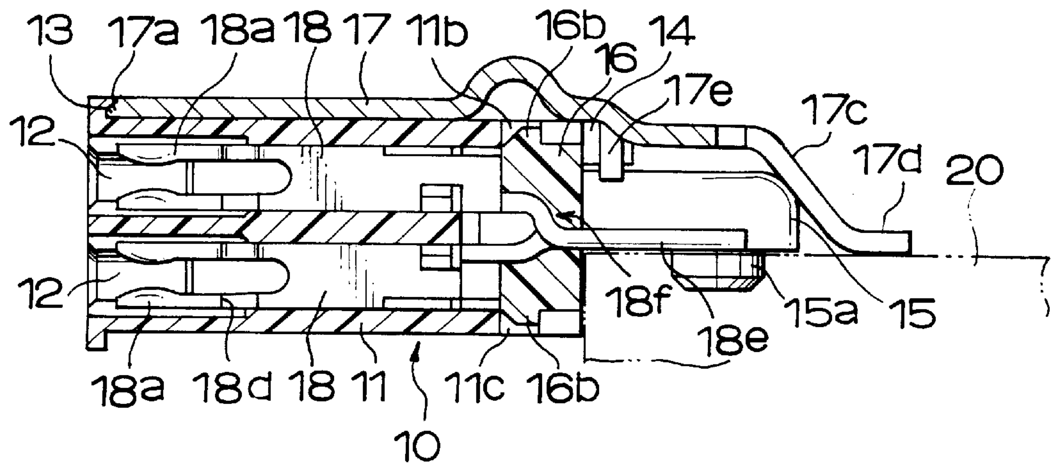
FIG. 20 shows how the card bus connector is mounted on the printed circuit board.
Figure 21:
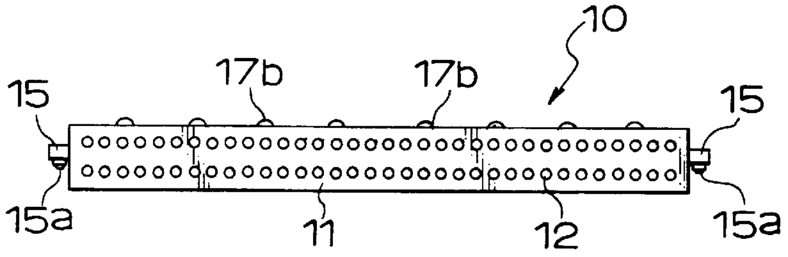
FIG. 21 is a front view of the card bus connector.
Figure 22:
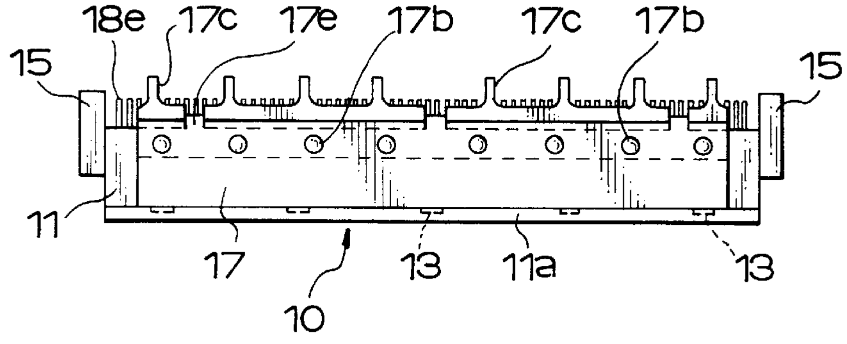
FIG. 22 is a plane view of the card bus connector.

The elongated contact-support mold 16 has two arms 15 formed on its opposite sides for putting the insulating housing 11 in correct position on the printed circuit board 20 (see FIG. 20). Each arm 15 has a positioning projection 15*a* on its bottom.

Advantageously, the insert molding of upper and lower lines of 68 female contact pieces 18 assures that the lead extensions 18*e* of the female contact pieces 18 are put in precise coplanar arrangement within a strict allowance (for instance, 0.1 mm) relative to the substrate of a printed circuit to which the card bus connector 10 is mounted. The so insert-molded contact pieces 18 are guaranteed to be free of any looseness in position, and accordingly free of any irregularities relative to the substrate of a printed circuit, which looseness and irregularities are liable to be caused in a conventional contact structure.

The contact-support mold 16 having upper and lower lines of 68 bifurcate female contact pieces 18 embedded therein is press-fitted in the insulating housing 11 by inserting the female contact pieces 18 in the contact holes 12 until its engagement projections 16*a* and 16*b* are snapped in the counter engagement apertures 11*b* and 11*c* of the insulating housing 11.

Figure 15:
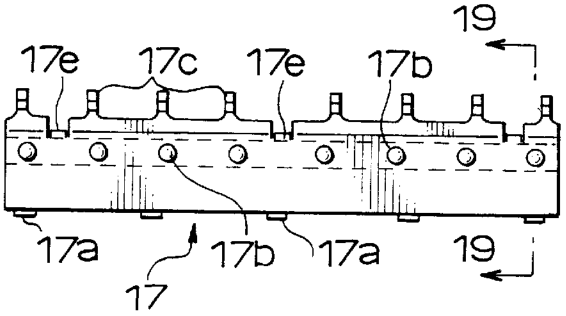
FIG. 15 is a plane view of a shield plate to be used in the card bus connector.
Figure 16:
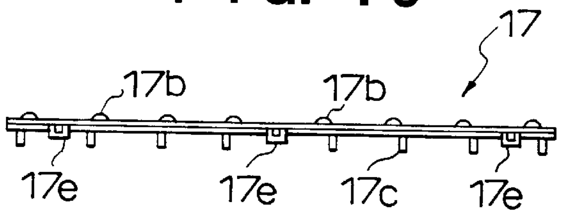
FIG. 16 is a front view of the shield plate.
Figure 17:
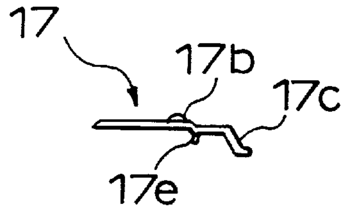
FIG. 17 is a side view of the shield plate.
Figure 18:
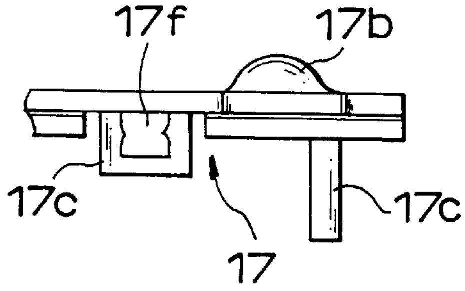
FIG. 18 is an enlarged front view of a fragment of the shield plate.

Referring to FIGS. 15 to 17, a shield plate 17 to be removably attached to the insulating housing 11 is a rectangular metal sheet large enough to cover the top surface of the insulating housing 11.

Figure 19:
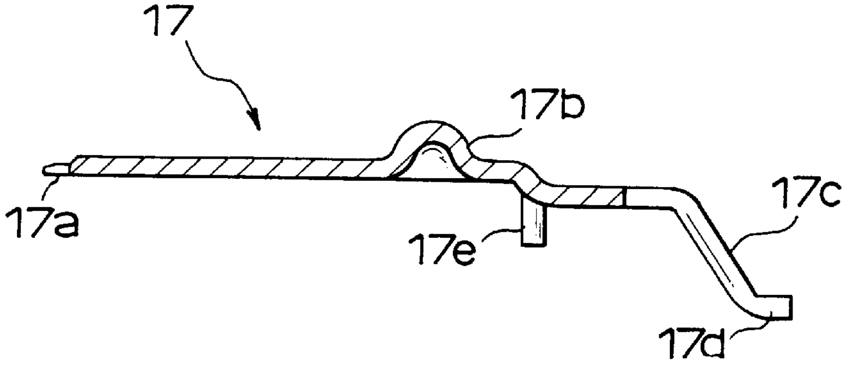
FIG. 19 is an enlarged cross section of the shield plate taken along the line 19—19 in FIG. 15.

As shown in FIGS. 15 and 19, five front projections 17*a* are made by pressing and reducing the thickness of the shield plate to half, and these front projections 17*a* are arranged at same intervals as the recesses 13 made in the front flange lla of the insulating housing 11.

Figure 24:
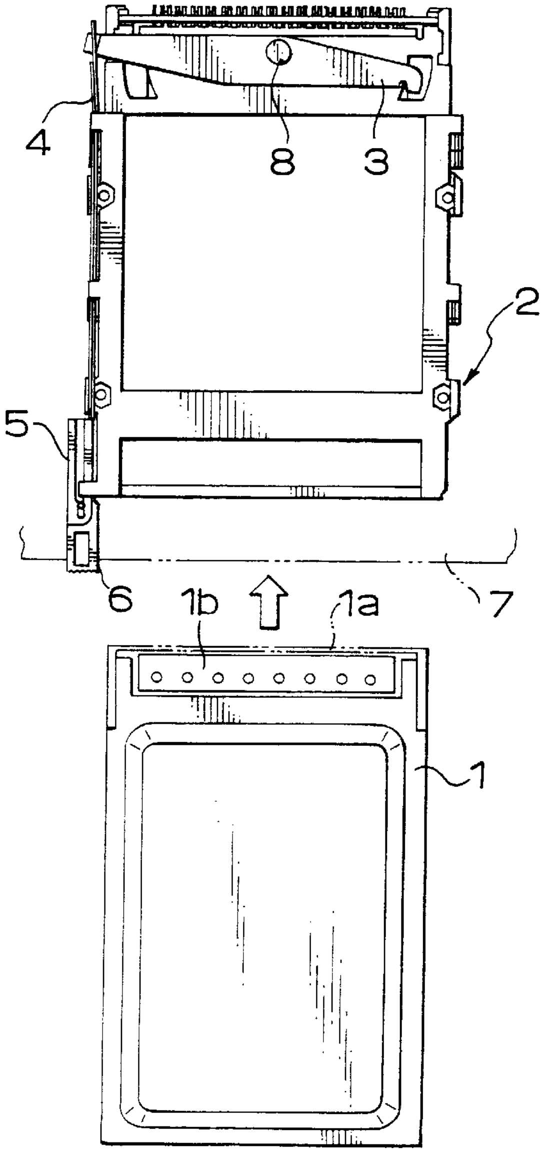
FIG. 24 PRIOR ART
FIG. 24 illustrates how a PC card is inserted in the card slot of a personal computer.

Also, the shield plate 17 has eight hemispherical projections 17*b* formed on its top surface. These hemispherical projections 17*b* are arranged in line, and will be put in contact with the counter shield plate, which is provided on the card bus connector 2 (see FIG. 24).

The shield plate 17 has eight soldering lead extensions 17*c* extending backward from its rear edge, and these soldering lead extensions 17*c* are so bent as to allow their lead ends 17*d* to be parallel to and coplanar with the substrate 20 of a printed circuit, selected conductors of which the lead ends 17*d* are to be reflow-soldered to.

Also, three "U"-shaped hooks 17*e* are formed on the rear edge of the shield plate 17, each for each three lead extensions 17*c*. The engagement projections 14 of the insulating housing 11 will be snapped in the openings of the "U"-shaped hooks 17*e* when the shield plate 17 is applied to the top surface of the insulating housing 11.

The manner in which a card bus connector, which is composed of an insulating housing 11 having a contact-support 16 and a shield plate 17 both attached thereto, can be mounted onto the substrate of a printed circuit is described as follows:

First, an insulating housing 11 having a contact-support 16 press-fitted therein is fixed to a printed circuit board 20 in correct position temporarily by inserting the positioning projections 15*a* of the contact-support mold 15 in counter positioning holes made in the printed circuit board 20. Then, the leads 18*e* of all female contact pieces 18 are put rightly on creamy solder applied to selected conductors in the printed circuit. Thereafter, the printed circuit board 20 having the insulating housing 11 thereon is made to pass through a reflow furnace to be heated for soldering the leads 18*e* of the female contact pieces 18 to the selected conductors of the printed circuit. If incomplete or defective solderings should be found at this stage, such incomplete or defective solderings can be fixed with much less difficulty than the clump of underlying contact lead and overhanging grounding leads both soldered to selected conductors of the printed circuit if the shield plate 17 were attached to the insulating housing 11.

After completing the soldering of the contact leads 18*e* to the printed circuit a shield plate 17 is applied to the top surface of the insulating housing 11 by inserting the front projections 17*a* of the shield plate 17 in the engagement recesses 13 of the front flange 11*a* of the insulating housing 11, and by making the engagement projections 14 of the insulating housing 11 to snap in the "U"-shaped hooks 17*e* of the rear edge of the shield plate 17. Then, the lead ends 17*d* of the shield plate 17 are put in the creamy solder applied to the grounding conductors in the printed circuit board 14.

Again, the printed circuit board 20 having the shield plate-and-insulating housing thereon is made to pass through a reflow furnace to be heated for soldering the leads 17*c* of the shield plate 17 to the grounding conductors of the printed circuit. Thus, the card bus connector 10 is mounted to the printed circuit board 14.

Figure 23A:
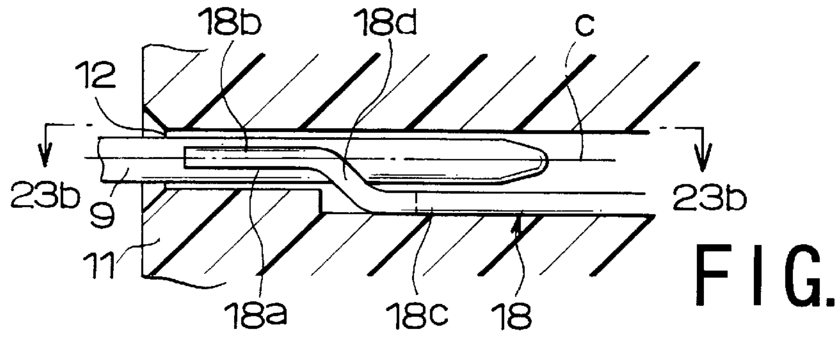
FIG. 23*a* shows how a male contact piece is inserted in the female bifurcate contact piece in the card bus connector.
Figure 23B:
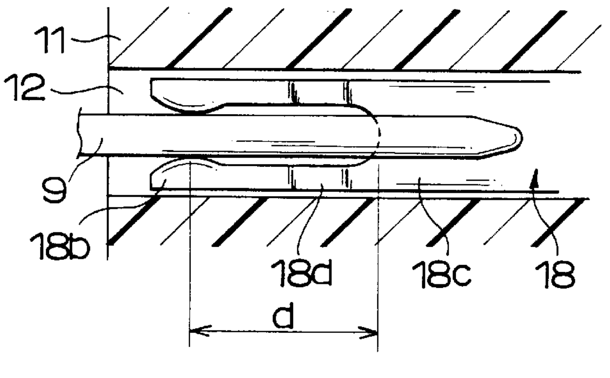
FIG. 23*b* is a similar view taken along the line 23*b*–23*b* in FIG. 23*a*.
Figure 25A:
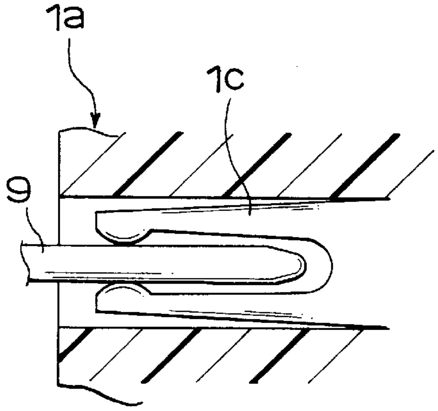
FIG. 25a PRIOR ART
FIGS. 25*a* and 25*b* are orthogonal sectional views, showing how a male contact piece is inserted in the female bifurcate contact piece in a conventional card bus connector.
Figure 25B:
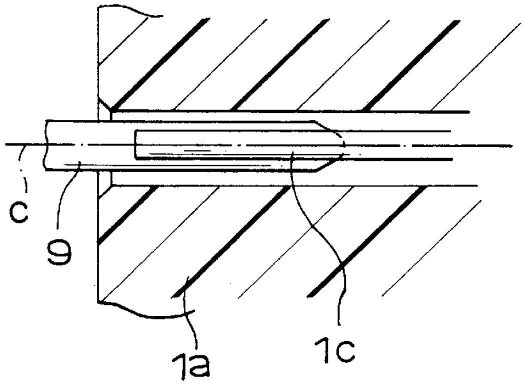
FIG. 25b PRIOR ART

Referring to FIGS. 23*a* and 23*b*, each bifurcate female contact piece 18 accommodates the counter male contact piece 9 when the PC card is inserted in the card slot. As shown in the drawings, the length "d" from the contact end 18*b* to the stem 18*c* of the female contact piece 18 is reduced substantially, compared with the corresponding length of the conventional straight contact piece as shown in FIG. 25, and the rigidity and hence the contact pressure applied by the contact end 18*b* of female contact piece 18 to the male contact piece 9 is increased accordingly.

What is claimed is:

1. A card bus connector comprising:

an insulating housing having a plurality of hollows defined therein; and a plurality of contact pieces mounted within corresponding ones of said plurality of hollows defined in the insulating housing, wherein each hollow has a step-wise transition (12*a*) therein and each contact piece has a stem and two prongs joined to the stem, the two prongs are bent to have contact sections (18*a*) and stepwise transitions (18*d*) so as to be in conformity with the step-wise transition (12*a*) of the corresponding hollow making the stem offset from a center longitudinal contact line centrally located between the contact sections (18*a*) for allowing a male contact piece to extend between the at least two prongs and along the stem within the corresponding hollow.

2. The card bus connector of claim 1, wherein, for each of the plurality of contact pieces, the length of said stem section located within said hollow is longer than the length of said a least two prongs located within said hollow.

3. The card bus connector of claim 1, wherein, for each of said plurality of contact pieces, the stem lies in a first plane, said prongs lie in a second plane, said first and second planes are spaced apart and parallel.

4. The card bus connector of claim 1, further comprising:

a contact-support mold, in which each of the contact pieces are embedded, positioned flush against a first surface of said insulating housing, wherein said hollows are elongated and extend between the first surface of said insulating housing and a second surface of said insulating housing.

5. The card bus connector of claim 1, further comprising:

a shield plate fixed to the surface of the insulating housing, the leads of the contact pieces and shield plate being connected to selected conductors of an associated printed circuit, which has the card bus connector fixed on its substrate.

6. The card bus connector of claim 1, wherein said contact pieces are bifurcate contact pieces.

* * * * *